United States Patent
Chiba

(10) Patent No.: US 10,475,618 B2
(45) Date of Patent: Nov. 12, 2019

(54) ELECTRON GUN CAPABLE OF SUPPRESSING THE INFLUENCE OF ELECTRON EMISSION FROM THE CATHODE SIDE SURFACE

(71) Applicant: NEC Network and Sensor Systems, Ltd., Fuchu-shi, Tokyo (JP)

(72) Inventor: Akira Chiba, Tokyo (JP)

(73) Assignee: NEC NETWORK AND SENSOR SYSTEMS, LTD., Tokyo (JP)

( * ) Notice: Subject to any disclaimer, the term of this patent is extended or adjusted under 35 U.S.C. 154(b) by 0 days.

(21) Appl. No.: 16/041,957

(22) Filed: Jul. 23, 2018

(65) Prior Publication Data

US 2019/0027335 A1 Jan. 24, 2019

(30) Foreign Application Priority Data

Jul. 24, 2017 (JP) ................................. 2017-142457

(51) Int. Cl.
*H01J 29/48* (2006.01)
*H01J 37/075* (2006.01)

(52) U.S. Cl.
CPC .......... *H01J 29/484* (2013.01); *H01J 29/488* (2013.01); *H01J 37/075* (2013.01)

(58) Field of Classification Search
CPC ....... H01J 29/484; H01J 37/075; H01J 29/488
See application file for complete search history.

(56) References Cited

U.S. PATENT DOCUMENTS

| | | | | |
|---|---|---|---|---|
| 3,686,727 A * | 8/1972 | Say | ........................ | B82Y 10/00 313/411 |
| 4,091,311 A * | 5/1978 | Mendelsohn | ............. | H01J 3/02 313/455 |
| 4,185,223 A * | 1/1980 | Anezaki | ................ | H01J 29/484 313/446 |
| 4,873,468 A * | 10/1989 | Miram | ...................... | H01J 3/02 313/411 |
| 6,462,466 B1 * | 10/2002 | Sugawara | ............... | H01J 29/92 313/318.01 |
| 6,512,235 B1 * | 1/2003 | Eitan | ...................... | B82Y 10/00 250/398 |
| 6,774,552 B2 * | 8/2004 | Chiba | ..................... | H01J 3/027 313/448 |
| 2006/0091776 A1 * | 5/2006 | Munehiro | ............... | H01J 3/024 313/337 |
| 2009/0009086 A1 * | 1/2009 | Soga | ........................ | H01J 23/50 315/3.5 |

(Continued)

FOREIGN PATENT DOCUMENTS

| | | |
|---|---|---|
| JP | S59-146850 U | 10/1984 |
| JP | H01-142148 U | 9/1989 |

*Primary Examiner* — Tracie Y Green

(57) ABSTRACT

To suppress both influence of electron emission from a cathode side surface and consumption of energy to be supplied to a heater, while being provided with a grid, an electron gun of the present invention includes: a cathode capable of emitting electrons by heating; a grid capable of controlling the electron emission; and a cathode shield which is an conductor including a material portion located in the vicinity of a side surface of the cathode and facing at least a portion of the side surface via a gap or a heat insulating material, and not being made in direct physical coupling nor in direct physical contact with the cathode.

20 Claims, 10 Drawing Sheets

(56) References Cited

U.S. PATENT DOCUMENTS

| | | | | |
|---|---|---|---|---|
| 2009/0251054 A1* | 10/2009 | Chiba | ............... | H01J 23/027 |
| | | | | 315/3.5 |
| 2010/0040201 A1* | 2/2010 | Lee | ............... | H01J 35/06 |
| | | | | 378/136 |
| 2011/0266951 A1* | 11/2011 | Andre | ............... | H01J 23/02 |
| | | | | 315/5.13 |
| 2017/0358424 A1* | 12/2017 | Liu | ............... | C01B 32/182 |

* cited by examiner

Fig.6
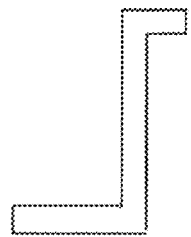
(a)
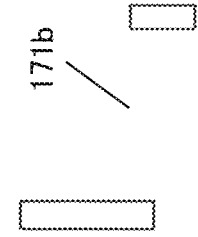
(b)

ELECTRON GUN 131y

ELECTRON GUN CAPABLE OF SUPPRESSING THE INFLUENCE OF ELECTRON EMISSION FROM THE CATHODE SIDE SURFACE

This application is based upon and claims the benefit of priority from Japanese Patent Application No. 2017-142457, filed on Jul. 24, 2017, the disclosure of which is incorporated herein in its entirety by reference.

TECHNICAL FIELD

The present invention relates to a device for emitting electrons.

BACKGROUND ART

A traveling wave tube and a klystron are electron tubes which rely on interaction of an electron beam emitted from an electron gun with a high frequency circuit for amplifying microwaves. As illustrated in FIG. 8, for example, these electron tubes are each composed of electron gun 131 for emitting an electron beam; high frequency circuit 15 for promoting the interaction of the electron beam emitted from electron gun 131 with a high frequency signal (microwave); a collector 16 for capturing the electron beam delivered from high frequency circuit 15; and anode electrode 136 for guiding the electron beam emitted from electron gun 131 into high frequency circuit 15.

An electron beam emitted from cathode surface of electron gun 131 is introduced into high frequency circuit 15 through anode electrode 136, and travels within high frequency circuit 15 while it interacts with a high frequency signal applied to high frequency circuit 15. The electron beam delivered from high frequency circuit 15 is applied to collector 16 and captured by a collector electrode included in collector 16. In this event, high frequency circuit 15 delivers a high frequency signal which is amplified through the interaction with the electron beam.

Electrons emitted from a side of cathode surface make defocus the electron beam of cathode surface. The defocused beam decrease the pass electrons to high frequency circuit, and decrease the amplification through the interaction with the pass electron beam.

For suppressing such influence of side emission, it is effective to dispose an electrical conductive "metal" in the vicinity of a side portion of the cathode.

In a case of an electron gun provided with no grid, the side emission can be suppressed by disposing a focus electrode, as the above-described metal, in the vicinity of a side portion of the cathode. However, in a case of a gridded electron gun, the grid needs to be disposed between the cathode and a focus electrode. Accordingly, in the case of a gridded electron gun, it is difficult to dispose the focus electrode in the vicinity of a side portion of the cathode.

As a method for resolving the above problem, a method of disposing a cathode shield, which is a metal, in contact with a side portion of the cathode is considered.

FIG. 9 is a cross-sectional schematic diagram showing a configuration in the vicinity of a cathode, of an electron gun 131y which is considered to be a general one of electron guns provided with a cathode shield.

The electron gun 131y includes a cathode 206, a metal 211, a cathode shield 221 and a heater 216.

The cathode 206 is heated by the heater 216 and thereby electrons from cathode 206 emit into a vacuum space.

Between the cathode 206 and the cylindrically shaped metal 211, a cathode shield 221, which is a cylindrically shaped metal is disposed. The cathode shield 221 is fixed to the cathode 206, by being inserted between the cathode 206 and the metal 211 or being welded to the cathode 206. Electrons emitted from a side surface of the cathode 206 are shielded by the cathode shield 221. Accordingly, the configuration shown in FIG. 9 can mitigate influence of the electrons emitted from the side surface of the cathode 206.

Japanese Utility Model Laid-Open No. H01-142148 discloses a power supply unit for grid-pulsed traveling-wave tube consisting of a heater power supply, a grid power supply, a collector power supply and a helix power supply.

Japanese Utility Model Laid-Open No. S59-146850 discloses an electron tube provided with an electron gun unit including a cylindrical ceramic outer shell component both of whose end surfaces each have a metal electrode attached to the surface, the metal electrodes being for applying a high DC voltage between them.

In the electron gun 131y shown in FIG. 9, the cathode 206 is in contact with the cathode shield 221, which is thermally conductive, as described above. Accordingly, thermal energy supplied from the heater 216 to the cathode 206 is transmitted to the cathode shield 221 and, thereby, thermal radiation of cathode shield 221 is increased. As a result, a problem that energy to be supplied to the heater 216, for heating the cathode 206, increases arises.

SUMMARY

The present invention is aimed at providing an electron gun or the like which is provided with a grid and also is capable of suppressing both influence of electron emission from a cathode side surface and consumption of energy to be supplied to a heater.

An electron gun of the present invention includes: a cathode capable of emitting electrons by heating; a grid capable of controlling the electron emission of cathode; and a cathode shield which is an electricity conductive material including a surface located in the vicinity of a side surface of the cathode and facing at least a portion of the side surface via an gap or a heat insulating material, and not being made in direct physical bonding nor in direct physical contact with the cathode.

An electron gun or the like of the present invention is provided with a grid and also is capable of suppressing both influence of electron emission from a cathode side surface and consumption of energy to be supplied to a heater.

BRIEF DESCRIPTION OF THE DRAWINGS

Exemplary features and advantages of the present invention will become apparent from the following detailed description when taken with the accompanying drawings in which:

FIG. 6 is a schematic diagram (second one) showing the second example of a configuration of a cathode shield of the example embodiment;

EXAMPLE EMBODIMENT

Next, a detailed explanation will be given for a first example embodiment with reference to the drawings.

Configuration and Operation

Figure 1:
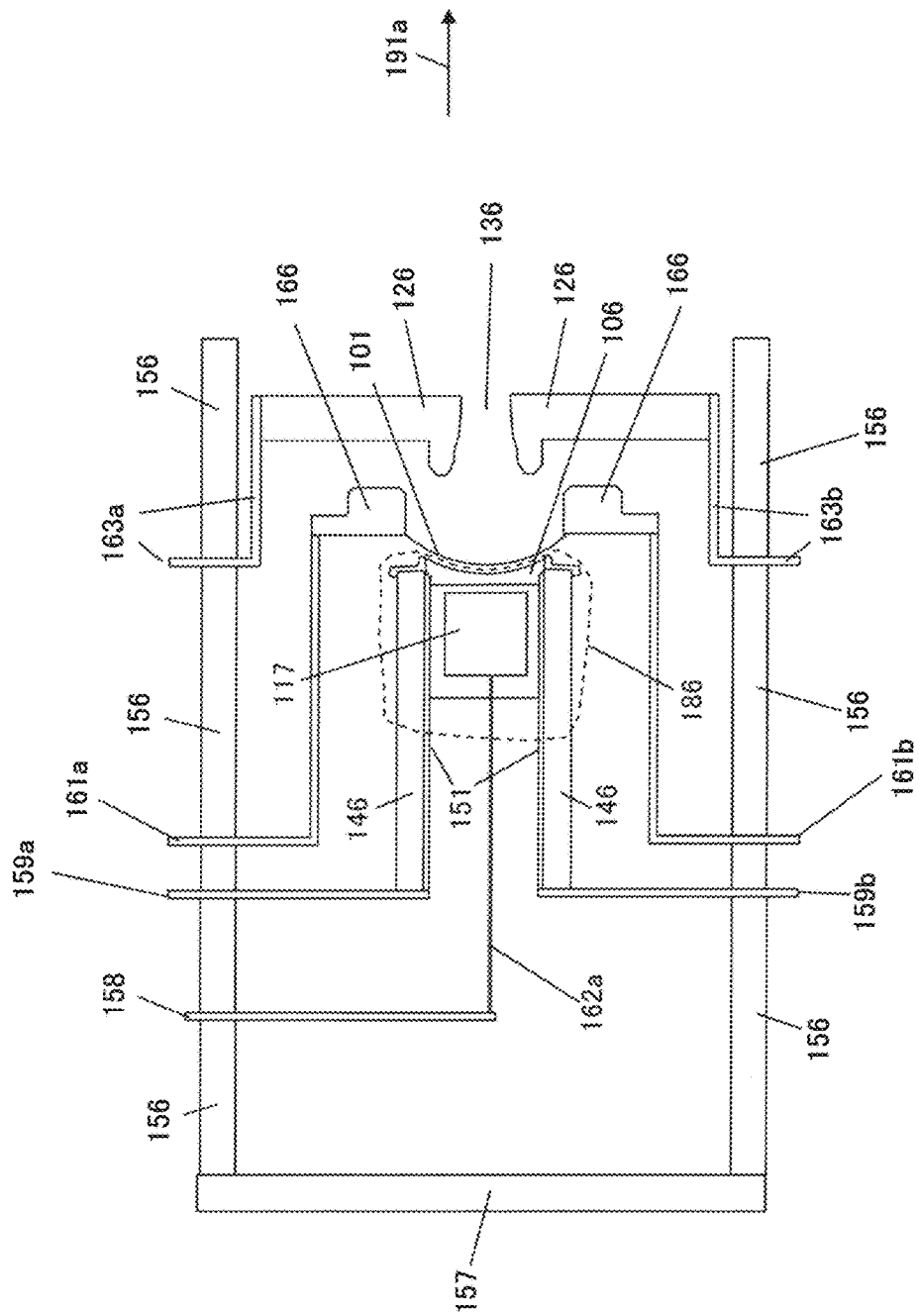
FIG. 1 is a vertical cross-sectional schematic diagram showing an example of a configuration of an electron gun of an example embodiment.

FIG. 1 is a vertical cross-sectional schematic diagram showing a configuration of an electron gun 131, which is an example of an electron gun of the present example embodiment.

The electron gun 131 includes a heater 117, a cathode 106, a grid 101, an anode electrode 126, a focus electrode 166, electrode 158, 159*a*, 159*b*, 161*a*, 161*b*, 163*a* and 163*b*, electricity conductive materials 146, 157 and 162*a*, and ceramic insulator 156.

The electron gun 131, inside is kept at vacuum, is a device for emitting electrons from cathode through an anode electrode 136 illustrated in FIG. 1 in the direction of an arrow 191*a*.

The ceramic insulator 156 is an electrically insulating material. The ceramic insulator 156 may have any shape and, for example, has a cylindrical shape. The ceramic insulator 156 can be substituted to insulating material other than ceramic.

The electricity conductive materials 146, 157 and 162*a*, and, the electrodes 158, 159*a*, 159*b*, 161*a*, 161*b*, 163*a* and 163*b*, are electrically conductive materials.

The ceramic insulator 156 is assembled with each of the electricity conductive materials 157, and, electrodes 158, 159*a*, 159*b*, 161*a*, 161*b*, 163*a* and 163, in a manner not to make any leak-pass so as to make it possible to keep the inside of the electron gun 131 at vacuum when the electron gun 131 is installed in a vacuum apparatus.

An example of a region 186 illustrated in FIG. 1 will be described later, with reference to FIG. 2.

The heater 117 heats the cathode 106 by means of electric power supplied from the outside via the electrodes 158, 162*a* and 159*a*.

By the heating from the heater 117, temperature of the cathode 106 rises to about 1,000 degrees. Thus, the cathode 106 heated emits electrons into a vacuum space.

To the cathode 106, a first electric potential of DC is provided from a first power supply not illustrated in the diagram, via the electrode 159*a* and the electricity conductive material 151. The first electric potential is provided also to the electricity conductive material 146 via the electrode 159*a*.

The focus electrode 166 is an electrode for focusing the electrons emitted from the cathode 106 so that the electrons effectively pass through the anode electrode 136. To the focus electrode 166, a second electric potential is provided from a second power supply not illustrated in the diagram, via the electrode 161*a*.

The focus electrode 166 is unified with the grid 101. The second electric potential is an electric potential for causing the focus electrode 166 to focus electrons and also for driving the grid 101. An electric potential in a pulse is provide for the grid 101 and the focus electrode 166.

To the anode electrode 126, a third electric potential of DC is provided from a third power supply not illustrated in the diagram, via the electrode 163*a*. By the effect of a first voltage corresponding to the difference between the third electric potential and the first electric potential described earlier, the electrons emitted from the cathode 106 travel toward the anode electrode 136. Then, the electrons pass through the anode electrode 136 and further travel primarily in the direction of the arrow 191*a*.

The grid 101 has, for example, a mesh-like structure composed of an electrically conductive material. By the second electric potential, quantity of the electrons' traveling from the cathode 106 in the direction of the arrow 191*a*, passing through the grid 101, is controlled. The control is, for example, that of performing on/off of the electrons' traveling.

Figure 2:
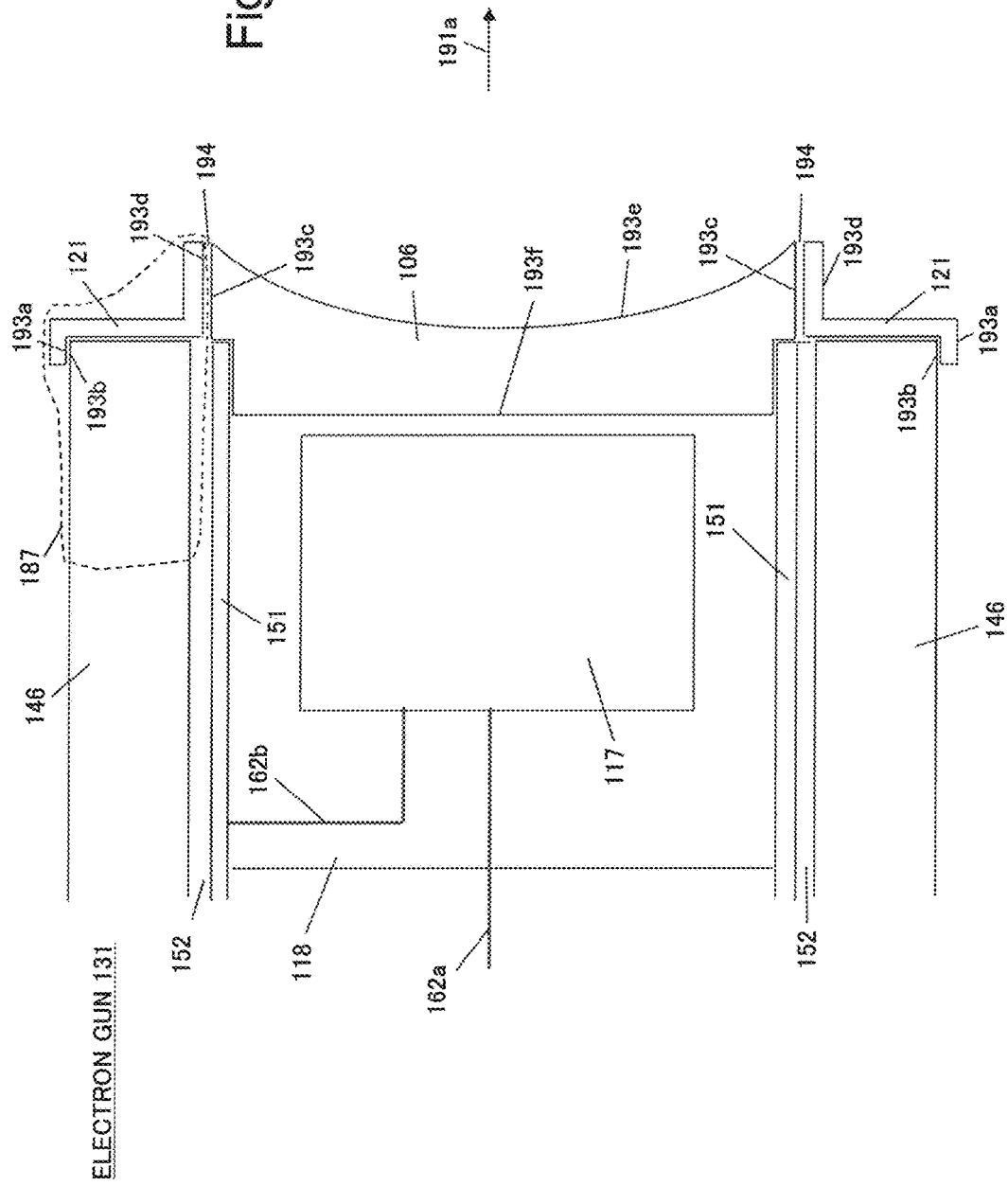
FIG. 2 is a schematic diagram (first one) showing an example of a configuration in a region 186 of the electron gun of the example embodiment.

FIG. 2 is a schematic diagram showing an example of a configuration in a region 186 of the electron gun 131 shown in FIG. 1.

In the region 186, the electron gun 131 includes the cathode 106, the cathode shield 121, the electricity conductive materials 146, 151, 162*a* and 162*b*, and the heater 117.

The heater 117 heats the cathode 106 by means of electric power supplied from the outside via the electricity conductive material 162*a*. Here, a terminal of the heater 117 different from the other one coupled to the electricity conductive material 162*a* is connected to the electricity conductive material 151 via the electricity conductive material 162*b*, which is an electricity conductive material. Power supplying to the heater 117 is caused by a difference between an electric potential provided from the outside via the electricity conductive material 162*a* and the first electric potential provided to the electricity conductive material 151.

An insulating material 118 is potted around the heater 117. For example, the insulating material 118 is alumina.

The cathode 106 is an impregnated cathode using as its base a high melting metal and porous capable of easily emitting electrons because of its low work function. The cathode 106 is made of, for example, tungsten or a composite material of tungsten with osmium, iridium or the like.

Heated from the heater 117, the cathode 106 temperature is about 1,000 degrees. Thus, the cathode 106 emits electrons into a vacuum space. The almost electrons emitted from the cathode surface 193*e*, but also some electrons emitted from a cathode side surface 193*c*. The side surface 193*c* is a portion of a side surface of the cathode 106, the portion being close to the surface 193*e*.

An insulating material 118 is potted in the electricity conductive material 151. The electricity conductive material 151 is a material for holding the cathode 106. The electricity conductive material 151 is in contact with the cathode 106. By thus contacting with the cathode 106, the electricity conductive material 151 works also as a material for providing the cathode 106 with the first electric potential provided via the electrode 159*a* illustrated in FIG. 1.

The electricity conductive material 151 is composed of, for example, a cylindrically shaped high melting metal. The electricity conductive material 151 includes, for example, molybdenum, molybdenum-rhenium alloy, tantalum, tungsten or tungsten-rhenium alloy.

The electricity conductive material 146 is composed outside the electricity conductive material 151. The electricity conductive material 146 is a material for radiation shield from heat generated by the heater 117 to the outside. For example, the electricity conductive material 146 is cylindrically shaped, and the electricity conductive materials 146 are composed with several, each disposed to be separated by a space. An example of a configuration of the electricity conductive material 146 will be described later, with reference to FIG. 4.

On the right side of the electricity conductive materials 146 illustrated in FIG. 2, the cathode shield 121, which is an electricity conductive material, is composed.

The cathode shield 121 includes, for example, a high melting metal such as molybdenum, molybdenum-rhenium alloy, tantalum, tungsten, and tungsten-rhenium alloy. By the use of a high melting metal for the cathode shield 121, it becomes possible to suppress damage such as deformation caused by thermal radiation from the cathode 106. Further, when a high melting metal is used for the cathode shield 121, melting or decomposition of the cathode shield 121 due to thermal radiation from the cathode 106 never occurs, and also vapor pressure of the cathode shield 121 at high temperature is low. Accordingly, the use of a high melting metal for the cathode shield 121 can suppress release of contaminant.

For example, the cathode shield 121 is fixed by contact between a surface 193a of the cathode shield 121 and a surface 193b of the electricity conductive material 146, both illustrated in FIG. 2. The cathode shield 121 may be joined to the electricity conductive material 146 by welding or the like, as will be described later. By the contact or joint described just above, the cathode shield 121 is contacted with the electricity conductive material 146 both electrically and thermally. Because, as described earlier, the electricity conductive material 146 is provided with the first electric potential, which is a potential to be provided to the cathode 106, the cathode shield 121 is at a potential equal to the first electric potential.

The side surface 193c of the cathode 106 is located in the vicinity of a surface 193d of the cathode shield 121 and faces the surface 193d. As a result, no potential difference (electric field) is generated between the cathode shield 121 and the surface 193d. Therefore, even if thermionic electrons are emitted from the side surface 193c, the electrons do not reach the cathode shield 121 via the surface 193d.

Between the cathode 106 and the cathode shield 121, a gap 194 is formed. Further, the cathode 106 and the cathode shield 121 are not made in physical contact nor in physical coupling with each other, at any portion. As a result, thermal coupling between the cathode 106 and the cathode shield 121 is reduced compared to when the cathode 106 and the cathode shield 121 are made physically in contact or coupling with each other.

A width of the gap 194 is, for example, around 0.2 mm. The width of the gap 194 is, for example, 0.1 to 1.0 mm.

From the viewpoint of suppressing electron emission from the side surface 193c, the width of the gap 194 is desired to be smaller. Smallness of the gap 194 can prevent the electric field within the gap 194 from deviating from the first electric potential, which is the electric field of both the cathode shield 121 and the focus electrode 166. When the gap 194 is small and the gap 194 accordingly is kept at the electric field of the first electric potential, electron emission from the side surface 193c can be suppressed.

From the viewpoint of making less thermal transmission from the cathode 106 to the cathode shield 121, the width of the gap 194 is to be large.

When the width of the gap 194 is extremely small, it can be expected that contact between the cathode 106 and the cathode shield 121 owing to a difference in thermal expansion coefficient between them, and deformation of the cathode shield 121. If contact between the cathode 106 and the cathode shield 121, thermal flow from the cathode 106 to the cathode shield 121 increases rapidly occurs.

The width of the gap 194 is determined from the viewpoints having been described above.

Here, electrons emitted from side surfaces other than the side surface 193c, among surfaces of the cathode 106, do not travel in the direction of the arrow 191a.

The electricity conductive material 151 is composed of a cylindrically shaped with high melting metal. For example, the electricity conductive material 151 includes, molybdenum, molybdenum-rhenium alloy or tantalum.

The electricity conductive material 146 is a material for mitigating thermal radiation generated by the heater 117 to the outside. The electricity conductive material 146 is cylindrically shaped. For example, the electricity conductive material 146 includes a plurality of metals each composed to be separated from the others with a space gap. An example of a configuration of the electricity conductive material 146 will be described later, with reference to FIG. 4.

The electricity conductive material 151, the heater 117, the insulating material 118 and the cathode 106 may be assembled together, all illustrated in FIG. 2.

Figure 3:
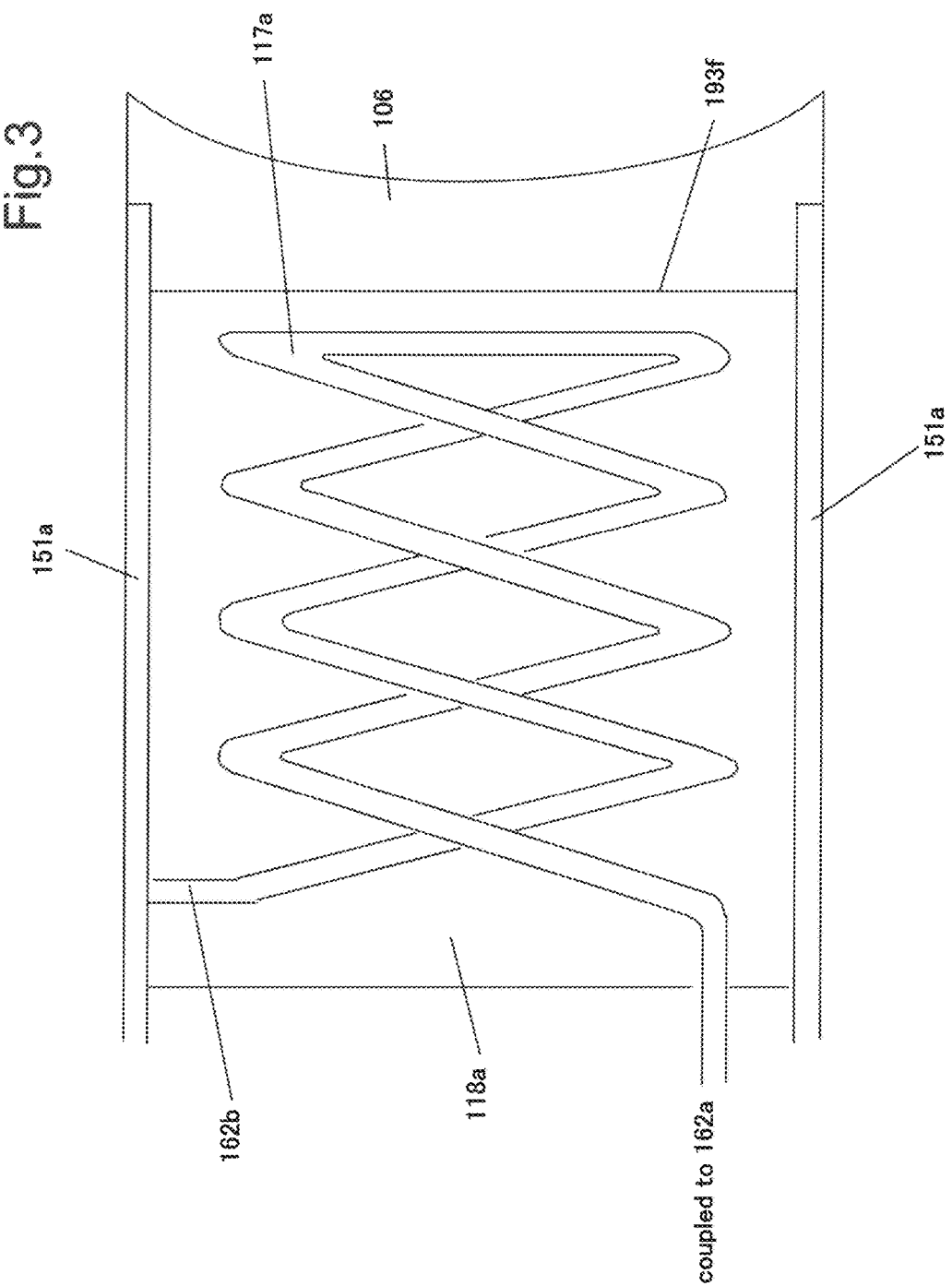
FIG. 3 is a schematic diagram showing an example of an integrally configured combination of an electricity conductive material 151, a heater 117 and a cathode 106.

FIG. 3 is a schematic diagram showing an assembling with the electricity conductive material 151, the heater 117, the insulating material 118 and the cathode 106. An electricity conductive material 151a, a heater 117a and an insulating material 118a are examples of, respectively, the electricity conductive material 151, the heater 117 and the insulating material 118 illustrated in FIG. 2.

As shown in FIG. 3, to the right side of the electricity conductive material 151a, which is cylindrically shaped, the cathode 106 is brazed at high temperature and fixed. Then, in a region surrounded by the electricity conductive material 151a and the surface 193f of the cathode 106, the heater 117a is formed by winding a high melting metal wire. An electricity conductive material 162b corresponding to an electrically conductive portion of the heater 117a around its one end is connected to the electricity conductive material 151a. The other end portion of the heater 117a is connected to the electricity conductive material 162a illustrated in FIG. 2. Around the heater 117a, the insulating material 118a is formed in a manner to be potted in the region surrounded by the electricity conductive material 151a and the surface 193f of the cathode 106. The insulating material 118a is, for example, alumina.

Figure 4:
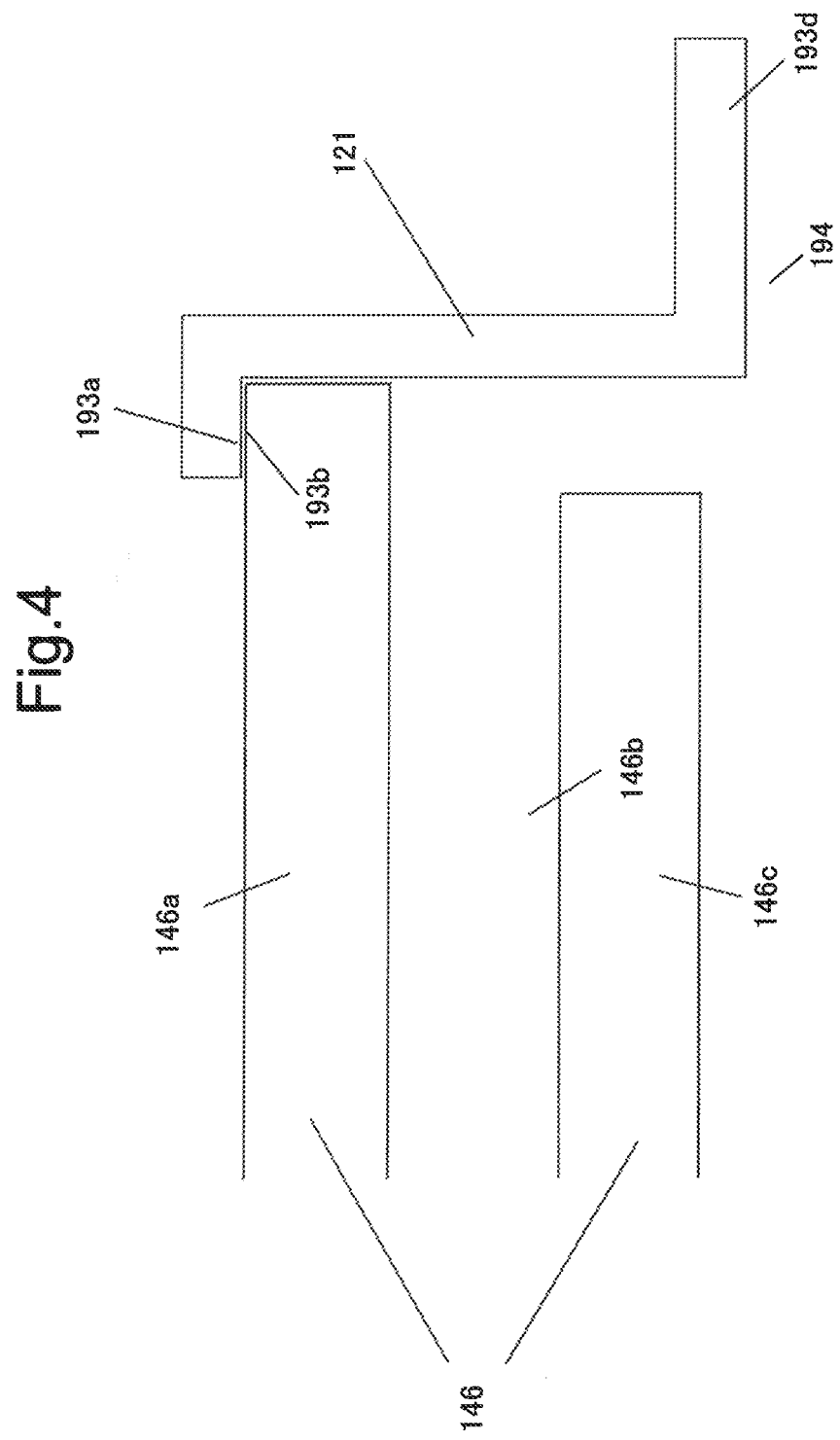
FIG. 4 is a schematic diagram showing an example of a configuration in a region 187 of the electron gun of the example embodiment.

FIG. 4 is a schematic diagram showing an example of a configuration in a region 187 of the electron gun 131 illustrated in FIG. 2.

The electricity conductive material 146 includes an electricity conductive material 146a and an electricity conductive material 146c. Between the electricity conductive material 146a and the electricity conductive material 146c, a space gap 146b is provided. By thus providing the space 146b between the electricity conductive material 146a and the electricity conductive material 146c, thermal transmission by the heater 117 illustrated in FIG. 2 is reduced from the electricity conductive material 146c to the electricity conductive material 146a.

Each of the electricity conductive materials 146a and 146c is, for example, a high melting metal. Each of the electricity conductive materials 146a and 146c includes, for example, molybdenum, molybdenum-rhenium alloy, tantalum, tungsten, or tungsten-rhenium alloy. Each of the electricity conductive materials 146a and 146c is formed, for example, by rolling up a metal sheet into a cylindrical shape and joining of the rolled metal sheet.

The cathode shield 121 is fixed to the electricity conductive material 146a by being made in contact and coupling with the electricity conductive material 146a.

Figure 5:
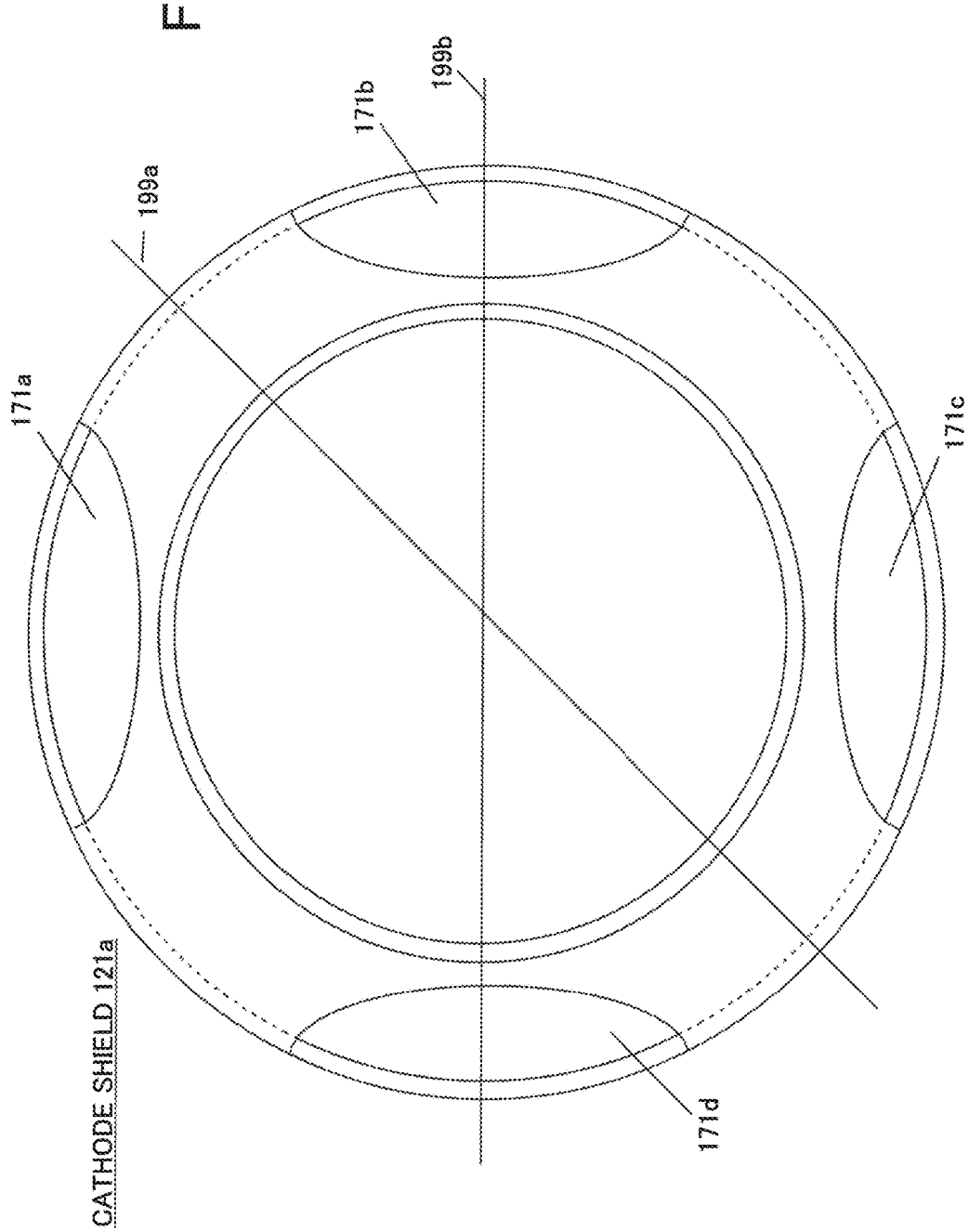
FIG. 5 is a schematic diagram (first one) showing a second example of a configuration of a cathode shield of the example embodiment.

FIGS. 5 and 6 are schematic diagrams showing a configuration of a cathode shield 121a which is a second example of the cathode shield 121 illustrated in FIG. 2.

FIG. 5 is a top view of the cathode shield 121a. FIG. 6(a) is a cross-sectional view of the cathode shield 121a, where the cathode shield 121a is assumed to be cut along a line 199a illustrated in FIG. 5. FIG. 6(b) is a cross-sectional view of the cathode shield 121a, where the cathode shield 121a is assumed to be cut along a line 199b illustrated in FIG. 5.

In the cathode shield 121a, top-surface-lack portions 171a to 171d, which are portions where the corresponding materials are lack, are formed. As will be described later, the top-surface-lack portions 171a to 171d are material-lack portions for facilitating welding between the electricity conductive material 146a and the cathode shield 121a, both illustrated in FIG. 4, from the top surface side illustrated in FIG. 5 (from above the page).

Figure 7:
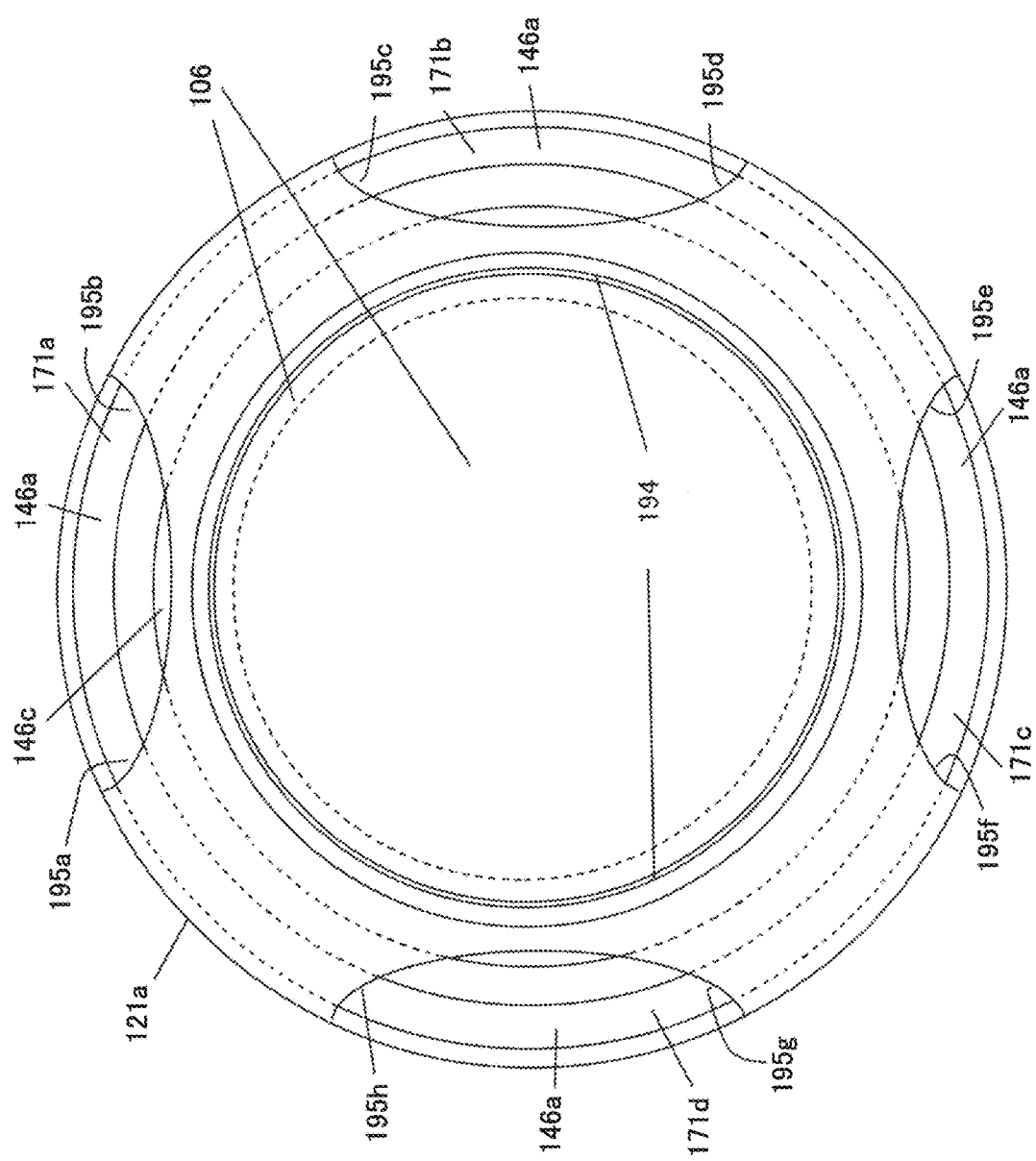
FIG. 7 is a schematic diagram showing an example of installation of the second example of a configuration of a cathode shield of the example embodiment.

FIG. 7 is a diagram of an electron gun employing the cathode shield 121a shown in FIGS. 5 and 6, as the cathode shield 121 illustrated in FIG. 1, when the electron gun is viewed in the inverse direction to the arrow 191a illustrated in FIG. 2.

The cathode shield 121a is welded to the electricity conductive material 146a at each of positions 195a to 195h. Alternatively, the cathode shield 121a may be welded to the electricity conductive material 146a at least one or more positions selected from among the positions 195a to 195h.

In the cathode shield 121a, the existence of the top-surface-lack portions 171a to 171d makes it easy to weld the electricity conductive material 146a illustrated in FIG. 4 with the cathode shield 121a from the top-surface side illustrated in FIG. 7 (from above the page).

Figure 8:
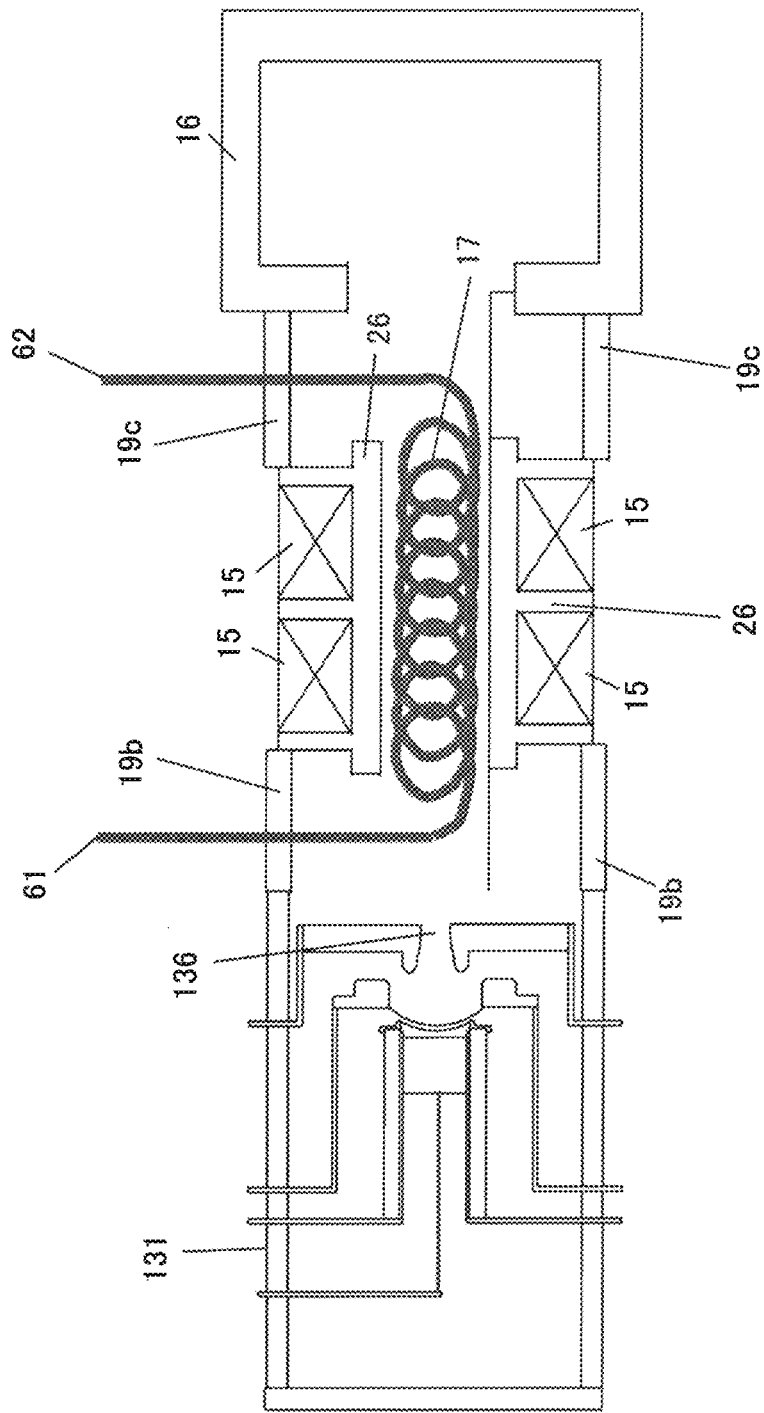
FIG. 8 is a schematic diagram showing an example of a configuration of a microwave tube provided with the electron gun of the example embodiment.
Figure 9:
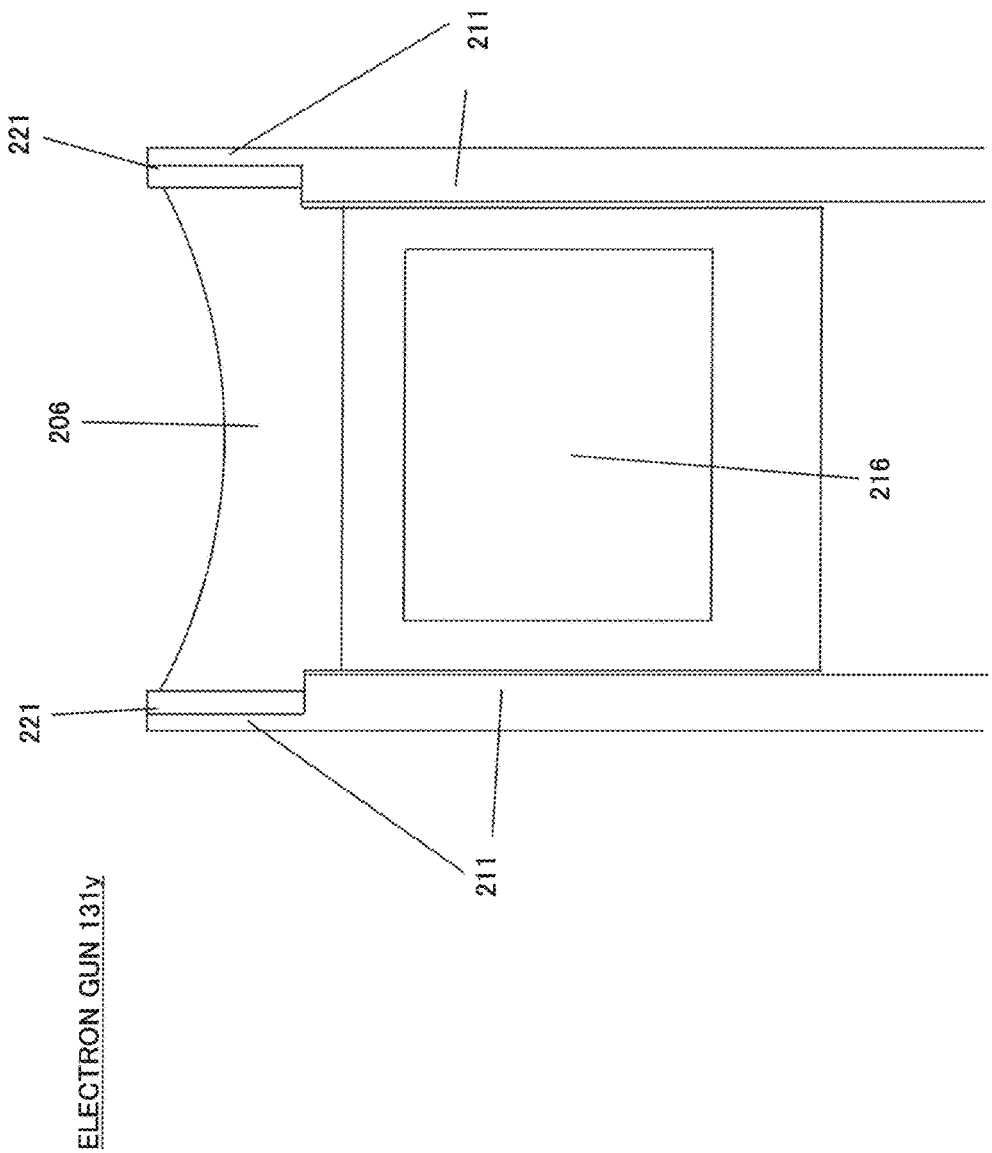
FIG. 9 is a schematic diagram showing an example of a configuration in the vicinity of a cathode of an electron gun considered to be a general one.

FIG. 8 is a schematic diagram showing an example of a configuration of a microwave tube 201, which is an example of a microwave tube provided with the electron gun 131 shown in FIG. 1.

The microwave tube 201 includes the electron gun 131, a helix 17, a high frequency circuit 15, a collector 16, an electricity conductive material 26, and ceramic insulators 19b and 19c.16

Electrons emitted from the cathode 106 of the electron gun 131 travel in the direction toward the helix 17 and the collector 16.

The high frequency circuit 15 is, for example, a cylindrical magnet which is arranged concentrically with the electron gun 131. For example, the magnet is a permanent magnet. The high frequency circuit 15 illustrated in FIG. 8 consists of two or more sets of cylindrical magnets. Here, the number of magnets constituting the high frequency circuit 15 is not limited to two, but may be any number.

By means of a magnetic field it generates, the high frequency circuit 15 controls the traveling direction of electrons emitted from the electron gun 131. The control is that to cause the electrons to travel within a vacuum space in the vicinity of the helix 17 enclosed by the helix 17 having a spiral shape, in the direction toward the collector 16.

The helix 17 is a long tape formed into a spiral shape. From an input portion 61 of the helix 17, a microwave is input from input portion 61 of the helix 17. The input microwave travels on the helix 17 toward an output portion 62, along the spiral shape of the helix 17. During the travel on the helix 17, the microwave causes interaction of energy with electrons emitted from the electron gun 131 and passing through the space in the vicinity of the helix 17. The microwave is amplified by the interaction. The amplified microwave is output from the output portion 62.

The helix 17 is kept at a fourth electric potential by a fourth power supply not illustrated in the diagram. The fourth electric potential is for adjusting the traveling of electrons from the cathode 106 toward the collector 16.

A fifth electric potential is applied to the collector 16 by a fifth power supply not illustrated in the diagram. By the effect of a voltage generated by the fifth electric potential, the electrons emitted from the cathode 106 absorb electrons colliding with them. Energy of electrons having collided is converted into heat. The converted heat is released outside from a surface of the collector 16.

The ceramic insulator 19b has a cylindrical shape, and insulates between the anode electrode of the electron gun 131 and the electricity conductive material 26. The ceramic insulator 19b also seals surroundings of the helix and the like in vacuum, together with other materials. For example, the ceramic insulator 19b is ceramics.

The electricity conductive material 26 surrounds the helix 17. The electricity conductive material 26 seals surroundings of the helix and the like in vacuum, together with other materials.

The ceramic insulator 19c has a cylindrical shape, for example, and insulates between the collector 16 and the electricity conductive material 26. The ceramic insulator 19c also seals surroundings of the helix and the like in vacuum, together with other materials. For example, the ceramic insulator 19c is ceramics.

The ceramic insulators 19b or 19c can be substituted to insulating material other than ceramic.

Advantageous Effects

In the electron gun of the present example embodiment, a surface of the cathode shield, which is an electricity conductive material, is at the same electric potential as that of the cathode, and is located in the vicinity of a side surface of the cathode in a manner to face the side surface. Accordingly, electron emission from the side surface of cathode is suppressed. As a result, by the effect of the cathode shield, the electron gun can suppress influence of electrons emitted from the side surface of cathode. The influence may further include damage of the grid caused by the electrons emitted from the cathode side surface.

The surface and the side surface, both described just above, are not in contact with each other, and the cathode shield and the cathode are not in contact with each other. Accordingly, compared to when the cathode shield and the cathode are in contact with each other, the electron gun can reduce heat flow from the cathode. As a result, the cathode shield can reduce electric power to be supplied to the heater.

In the method described in the background art section, which is considered to be a general one, it is likely that deformation is generated by a difference in thermal expansion coefficient between the cathode shield and the cathode and, accordingly, change in a state of thermal flow between the cathode shield and the cathode occurs. The phenomena may occur even when the cathode and the cathode shield are welded with each other. It is because a crack or deformation may be generated at a welding portion owing to the difference in thermal expansion described above.

When the state of thermal flow between the cathode shield and the cathode has changed, temperature of the cathode becomes more variable. It accordingly becomes necessary to precisely control the electric power to be supplied to the heater, but such control usually is difficult.

In the present example embodiment, a gap is present between the cathode shield and the cathode. Accordingly, by setting a size of the gap to be around a value not causing contact between the cathode shield and the cathode due to their thermal expansion, the electron gun of the present example embodiment can suppress change in the state of thermal flow between the cathode shield and the cathode. As a result, the electron gun can mitigate required accuracy of the control of electric power to be supplied to the heater.

The above description has been given of an example where the cathode shield is fixed to a material surrounding the heater. However, the material for fixing the cathode shield is not limited to a material surrounding the heater, but may be any other material.

Further, the cathode shield may have any shape as long as it includes a surface facing a side surface of the cathode and is not made in physical coupling nor in physical contact with the cathode.

Figure 10:
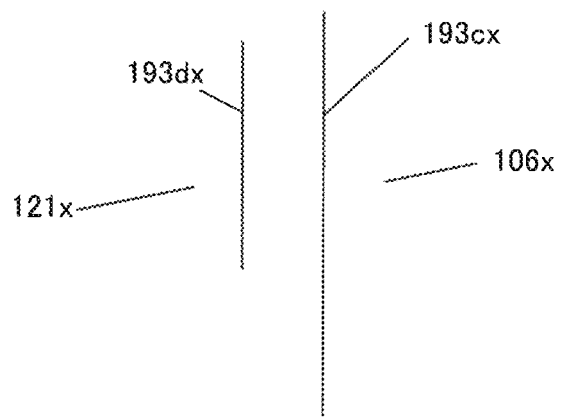
FIG. 10 is a diagram showing an example of a minimum configuration of the electron gun of the example embodiment.

Furthermore, while the above description has been given of an example where a gap is provided between the cathode shield and the cathode, a heat insulating material may be provided between the cathode shield and the cathode. FIG. 10 is a diagram showing a configuration of an electron gun 131$x$, which is a minimum configuration of the electron gun of the present example embodiment.

The electron gun 131$x$ includes a cathode 106$x$, a grid not illustrated in the diagram, and a cathode shield 121$x$.

The cathode 106$x$ can emit electrons by heating.

The grid can control the electron emission.

The cathode shield 121$x$ is located in the vicinity of a side surface 193$cx$ of the cathode 106$x$. Further, the cathode shield 121$x$ includes a surface 193$dx$ facing at least a portion of the side surface 193$cx$ via a gap or a heat insulating material, and is not made in physical coupling nor in physical contact with the cathode 106$x$.

The surface 193$dx$ of the cathode shield 121$x$ faces the side surface 193$cx$ of the cathode 106$x$, and is located in the vicinity of the side surface 193$cx$. Accordingly, electron emission from the side surface 193$cx$ is suppressed. As a result, the cathode shield can suppress influence of electrons emitted from the side surface 193$cx$.

Further, the surface 193$dx$ and the side surface 193$cx$ are not in contact with each other, and the cathode shield 121$x$ is not made in physical coupling nor in physical contact with the cathode 106$x$. Accordingly, compared to when the cathode shield and the cathode are in contact with each other, the electron gun 131$x$ can reduce heat flow from the cathode 106$x$. As a result, the electron gun 131$x$ can reduce consumption of energy to be supplied to the heater.

For the above-described reasons, by having the above-described configuration with a grid, the electron gun 131$x$ has an advantageous effect of reducing both influence of electron emission from a cathode side surface and consumption of energy to be supplied to a heater.

While example embodiments of the present invention have been described above, the present invention is not limited to the above-described example embodiments, and further modification, substitution and adjustment may be applied to the example embodiments within a range not departing from the basic technical concept of the present invention. For example, configurations of components illustrated in the drawings are just examples for helping understand the present invention, and there should be no restriction to the configurations illustrated in the drawings.

The whole or part of the example embodiments disclosed above can be described as, but not limited to, the following supplementary notes.

(Supplementary Note 1)

An electron gun comprising:

a cathode capable of emitting electrons by heating;

a grid capable of controlling the electron emission; and a cathode shield being an electricity conductive material, the electricity conductive material including a material portion located in the vicinity of a side surface of the cathode and facing at least a portion of the side surface via a gap or a heat insulating material, the electricity conductive material not being made in physical coupling nor in physical contact with the cathode.

(Supplementary Note 2)

The electron gun according to supplementary note 1, wherein the cathode shield is provided with an electric potential equal to or lower than a first electric potential, the electric potential being an electric potential approximately equal to an electric potential provided to the cathode.

(Supplementary Note 3)

The electron gun according to supplementary note 2, wherein the cathode shield is provided with the first electric potential.

(Supplementary Note 4)

The electron gun according to any one of supplementary notes 1 to 3, wherein the cathode shield includes at least one of tantalum, molybdenum, molybdenum-rhenium alloy, tungsten, and tungsten-rhenium alloy.

(Supplementary Note 5)

The electron gun according to any one of supplementary notes 1 to 4, wherein the cathode shield is physically in contact with a second conductor.

(Supplementary Note 6)

The electron gun according to any one of supplementary notes 1 to 5, wherein the cathode shield is physically in contact with a third conductor.

(Supplementary Note 7)

The electron gun according to any one of supplementary notes 1 to 6, further including an anode electrode provided with an anode electrode for passing the electrons, wherein the anode electrode also can apply a first voltage between it and the cathode.

(Supplementary Note 8)

The electron gun according to any one of supplementary notes 1 to 7, wherein an electric potential provided to the grid is a pulsed one.

(Supplementary Note 9)

The electron gun according to any one of supplementary notes 1 to 8, further including a heater for performing the heating.

(Supplementary Note 10)

The electron gun according to supplementary note 9, including a forth conductor around the heater.

(Supplementary Note 11)

The electron gun according to supplementary note 10, wherein the cathode shield is physically in contact with the forth conductor.

(Supplementary Note 12)

The electron gun according to supplementary note 10 or 11, wherein the cathode shield is made physically in coupling with the forth conductor.

(Supplementary Note 13)

The electron gun according to supplementary note 12, wherein the coupling is implemented by welding.

(Supplementary Note 14)

The electron gun according to any one of supplementary notes 10 to 13, wherein, in the cathode shield, near its portion in the vicinity of the forth conductor, a material-lack portion which is a portion where no material is present is formed.

(Supplementary Note 15)

The electron gun according to supplementary note 14, wherein an end of the material-lack portion in the cathode shield is welded to the forth conductor.

(Supplementary Note 16)

The electron gun according to supplementary note 10, wherein the forth conductor includes a first material and a second material located outside the first material.

(Supplementary Note 17)

The electron gun according to supplementary note 16, wherein a space is provided between the first material and the second material.

(Supplementary Note 18)

The electron gun according to supplementary note 16 or 17, wherein the cathode shield is physically in contact with the second material.

(Supplementary Note 19)

The electron gun according to any one of supplementary notes 16 to 18, wherein the cathode shield is made physically in coupling with the second material.

(Supplementary Note 20)

The electron gun according to supplementary note 19, wherein the coupling is implemented by welding.

(Supplementary Note 21)

The electron gun according to any one of supplementary notes 16 to 20, wherein, in the cathode shield, near its portion in the vicinity of the second material, a material-lack portion which is a portion where no material is present is formed.

(Supplementary Note 22)

The electron gun according to supplementary note 21, wherein an end of the material-lack portion in the cathode shield is welded to the second material.

(Supplementary Note 23)

A microwave tube comprising:

the electron gun according to any one of supplementary notes 1 to 22;

a high frequency circuit capable of improving probability that the electrons emitted by the electron gun pass near a helix;

the helix capable of amplifying a microwave input to it, by the electrons passing its vicinity; and a collector capable of causing the electrons emitted by the electron gun to pass near the helix.

REFERENCE SIGNS LIST

15 high frequency circuit
16 collector
17 helix
19b, 19c, 156 ceramic insulator
158, 159a, 159b, 161a, 161b, 162a, 163a and 163b electrode
26, 146, 146a, 146b, 151 electricity conductive material
61 input portion
62 output portion
106, 106x, 206 cathode
117 heater
117, 117a, 216 heater
118, 118a insulating material
121, 121a, 121x cathode shield
126 anode electrode
131, 131x, 131y electron gun
136 anode electrode
146b, 152 space
166 focus electrode
171a, 171b, 171c, 171d top-surface-lack portion
186, 187 region
191a arrow
193a, 193b, 193e, 193f surface
193c, 193cx side surface
193d, 193dx surface
194 gap
195a, 195b, 195c, 195d, 195e, 195f, 195g, 195h position
199a, 199b line
201 microwave tube
211 metal
221 cathode shield The previous description of embodiments is provided to enable a person skilled in the art to make and use the present invention. Moreover, various modifications to these example embodiments will be readily apparent to those skilled in the art, and the generic principles and specific examples defined herein may be applied to other embodiments without the use of inventive faculty. Therefore, the present invention is not intended to be limited to the example embodiments described herein but is to be accorded the widest scope as defined by the limitations of the claims and equivalents.

Further, it is noted that the inventor's intent is to retain all equivalents of the claimed invention even if the claims are amended during prosecution.

While the invention has been particularly shown and described with reference to example embodiments thereof, the invention is not limited to these embodiments. It will be understood by those of ordinary skill in the art that various changes in form and details may be made therein without departing from the spirit and scope of the present invention as defined by the claims.

What is claimed is:

1. An electron gun comprising:

a cathode capable of emitting electrons by heating;

a grid capable of controlling the electron emission; and a cathode shield being an electricity conductive material, including a material portion located in the vicinity of a side surface of the cathode and facing at least a portion of the side surface via a gap or a heat insulating material, not being made in physical coupling nor in physical contact with the cathode.

2. The electron gun according to claim 1, wherein the cathode shield is provided with an electric potential equal to or lower than a first electric potential, the electric potential being an electric potential approximately equal to an electric potential provided to the cathode.

3. The electron gun according to claim 1, wherein the cathode shield includes at least one of tantalum, molybdenum, molybdenum-rhenium alloy, tungsten, and tungsten-rhenium alloy.

4. The electron gun according to claim 1, wherein the cathode shield is physically in contact with a second electricity conductive material.

5. The electron gun according to claim 1, wherein the cathode shield is physically in contact with a third electricity conductive material in the second electricity conductive material.

6. The electron gun according to claim 1, further including an anode electrode provided with an anode electrode for passing the electrons, the anode electrode also enabling to apply a first voltage between it and the cathode.

7. The electron gun according to claim 1, wherein an electric potential provided to the grid is a pulsed one.

8. The electron gun according to claim 1, further including a heater for performing the heating.

9. The electron gun according to claim 8, including a fourth electricity conductive material around the heater.

10. The electron gun according to claim 9, wherein the cathode shield is physically in contact with the fourth electricity conductive material.

11. The electron gun according to claim 1, wherein, in the cathode shield, near its portion in the vicinity of the electricity conductive material, a material-lack portion which is a portion where no material is present is formed.

12. The electron gun according to claim 11, wherein an end of the material-lack portion in the cathode shield is welded to the electricity conductive material.

13. The electron gun according to claim 4, wherein the second electricity conductive material includes a first material and a second material located outside the first material.

14. The electron gun according to claim 13, wherein a space is provided between the first material and the second material.

15. The electron gun according to claim 13, wherein the cathode shield is physically in contact with the second material.

16. The electron gun according to claim 13, wherein the cathode shield is made physically in coupling with the second material.

17. The electron gun according to claim 16, wherein the coupling is implemented by welding.

18. The electron gun according to claim 13, wherein, in the cathode shield, near its portion in the vicinity of the second material, a material-lack portion which is a portion where no material is present is formed.

19. The electron gun according to claim 18, wherein an end of the material-lack portion in the cathode shield is welded to the second material.

20. A microwave tube comprising:
the electron gun according to claim 1;
a high frequency circuit capable of improving probability that the electrons emitted by the electron gun pass near a helix;
the helix capable of amplifying a microwave input to it, by the electrons passing its vicinity; and
a collector capable of causing the electrons emitted by the electron gun to pass near the helix.

* * * * *